(12) United States Patent
Morita et al.

(10) Patent No.: US 11,412,621 B2
(45) Date of Patent: Aug. 9, 2022

(54) DEVICE-EMBEDDED BOARD AND METHOD OF MANUFACTURING THE SAME

(71) Applicant: TDK CORPORATION, Tokyo (JP)

(72) Inventors: Takaaki Morita, Tokyo (JP); Seiichi Tajima, Tokyo (JP); Takashi Kariya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/812,671

(22) Filed: Mar. 9, 2020

(65) Prior Publication Data

US 2020/0315034 A1 Oct. 1, 2020

(30) Foreign Application Priority Data

Mar. 29, 2019 (JP) .............................. JP2019-068671

(51) Int. Cl.
| | |
|---|---|
| *H05K 1/16* | (2006.01) |
| *H05K 1/18* | (2006.01) |
| *H05K 3/20* | (2006.01) |
| *H01L 23/64* | (2006.01) |
| *H01L 23/66* | (2006.01) |
| *H01L 23/495* | (2006.01) |
| *H01L 23/522* | (2006.01) |
| *H01F 27/24* | (2006.01) |
| *H01F 27/28* | (2006.01) |
| *H01F 27/29* | (2006.01) |
| *H01F 27/32* | (2006.01) |
| *H05K 3/46* | (2006.01) |
| *H05K 1/11* | (2006.01) |
| *H05K 3/10* | (2006.01) |
| *H05K 1/03* | (2006.01) |

(52) U.S. Cl.
CPC ......... *H05K 3/4644* (2013.01); *H05K 1/0353* (2013.01); *H05K 1/115* (2013.01); *H05K 1/185* (2013.01); *H05K 3/10* (2013.01); *H05K 2201/015* (2013.01); *H05K 2201/0141* (2013.01)

(58) Field of Classification Search
CPC .. H05K 1/02; H05K 1/16; H05K 1/18; H05K 1/116; H05K 1/185; H05K 3/20; H05K 3/30; H05K 3/46; H05K 3/205; H01L 23/64; H01L 23/66; H01L 23/495; H01L 23/522
USPC ........... 361/761, 728, 763; 174/255; 336/61, 336/192

See application file for complete search history.

(56) References Cited

U.S. PATENT DOCUMENTS

| | | | | |
|---|---|---|---|---|
| 6,952,049 B1 * | 10/2005 | Ogawa | ................... | H01L 23/13 257/700 |
| 2001/0023779 A1 * | 9/2001 | Sugaya | ................. | H05K 3/205 174/255 |

(Continued)

FOREIGN PATENT DOCUMENTS

JP 2014-131039 A 7/2014

*Primary Examiner* — Xiaoliang Chen
(74) *Attorney, Agent, or Firm* — Oliff PLC

(57) ABSTRACT

A device-embedded board includes a board main body, conductor wiring layers formed inside or on a surface of the board main body, and device formation layers formed inside the board main body so as to be in contact with a portion of the conductor wiring layers. The device formation layer is configured in an insulating region in which functional filler for forming a devices is dispersed.

8 Claims, 20 Drawing Sheets

(56) References Cited

U.S. PATENT DOCUMENTS

| | | | |
|---|---|---|---|
| 2003/0030155 A1* | 2/2003 | Toyoda | H01L 23/295 257/788 |
| 2004/0118600 A1* | 6/2004 | Lee | H05K 1/162 174/260 |
| 2004/0118602 A1* | 6/2004 | Lee | H05K 1/162 174/260 |
| 2004/0121266 A1* | 6/2004 | Lee | H05K 1/162 430/313 |
| 2005/0029515 A1* | 2/2005 | Nagai | H01G 4/206 257/40 |
| 2006/0062976 A1* | 3/2006 | Sohn | B32B 7/04 428/209 |
| 2007/0263339 A1* | 11/2007 | Sugioka | H05K 1/162 361/305 |
| 2008/0257480 A1* | 10/2008 | Nakamura | H05K 1/162 156/150 |
| 2008/0289865 A1* | 11/2008 | Nakamura | H05K 1/162 174/260 |
| 2009/0073667 A1* | 3/2009 | Chung | H01L 23/642 361/763 |
| 2009/0129039 A1* | 5/2009 | Kariya | H05K 1/18 361/782 |
| 2013/0200977 A1* | 8/2013 | Miyazaki | H05K 1/185 336/192 |
| 2014/0118976 A1* | 5/2014 | Yoshikawa | H01L 23/49827 361/763 |
| 2014/0185258 A1 | 7/2014 | Lee et al. | |
| 2014/0275915 A1* | 9/2014 | Boone | H01F 27/2804 600/374 |
| 2015/0035718 A1* | 2/2015 | Gouchi | H01Q 1/36 343/788 |
| 2015/0056624 A1* | 2/2015 | Cramer | C12Q 1/6806 435/6.12 |
| 2015/0116950 A1* | 4/2015 | Yoo | H05K 1/185 361/728 |
| 2016/0254086 A1* | 9/2016 | Kim | H01F 27/22 336/61 |
| 2016/0284462 A1* | 9/2016 | Ahn | H01F 27/06 |
| 2016/0309593 A1* | 10/2016 | Hiroshima | H05K 1/185 |
| 2016/0330839 A1* | 11/2016 | Kuwako | H05K 3/4602 |
| 2017/0231085 A1* | 8/2017 | Otsubo | H05K 1/165 |
| 2017/0352471 A1* | 12/2017 | Mano | H01F 27/324 |
| 2018/0075965 A1* | 3/2018 | Yoshioka | H01F 27/29 |
| 2019/0244743 A1* | 8/2019 | Hirai | H01F 27/29 |
| 2020/0066634 A1* | 2/2020 | Do | H01L 23/49822 |

\* cited by examiner

DEVICE-EMBEDDED BOARD AND METHOD OF MANUFACTURING THE SAME

BACKGROUND OF THE INVENTION

1. Field of the Invention

The present invention relates to a device-embedded board in which devices such as a capacitor and an inductor are embedded, and a method of manufacturing the same.

2. Description of the Related Art

As a board in which passive devices such as a capacitor are embedded, for example, a device-embedded board disclosed in JP 2014-131039 A described below is known. As disclosed in JP 2014-131039 A, in the device-embedded board in the related art, the board is manufactured by preparing a recess or a space for burying devices such as a capacitor inside the board and burying the devices inside thereof.

However, in such a device-embedded board in the related art, it is necessary to separately manufacture devices such as a capacitor, and further, a task of burying the separately manufactured devices inside the board is required. In addition, it is difficult to reduce the thickness of the board because the separately manufactured devices are embedded inside the board.

In addition, due to the increase in signal frequency of a printed wiring board in recent years, demands for a printed wiring board using a thermoplastic resin having a high-frequency characteristic higher than that of a resin wiring board in the related art using a thermosetting resin such as an epoxy resin have been increased. However, in a wiring board configured with a thermoplastic resin that requires a higher molding temperature, it is more difficult to embed passive devices from the viewpoint of heat resistance of the embedded devices or the like.

SUMMARY OF THE INVENTION

The invention has been made in view of such circumstances, and an object of the invention is to provide a device-embedded board that is easy to manufacture and can be made thinner and a method of manufacturing the same.

In order to achieve the above object, a device-embedded board according to the invention includes:
  a board main body;
  a conductor wiring layer formed inside or on a surface of the board main body; and
  a device formation layer formed inside the board main body so as to be in contact with a portion of the conductor wiring layer,
  in which the device formation layer is configured in an insulating region in which functional filler for forming a device is dispersed.

In the device-embedded board according to the invention, for example, the device formation layer that becomes a portion of a capacitor or a portion of an inductor is configured in the insulating region formed together with the insulating layer. For this reason, for example, in the process of manufacturing the board, the device formation layer can be formed simultaneously, and thus, it is not necessary to manufacture, for example, a passive device such as a capacitor or an inductor separately from the board. Therefore, the task of burying the device in the board is not required. Furthermore, since the devices are formed in the board in the processes of manufacturing the board, it is possible to reduce the thickness of the board.

Preferably, a resin constituting the insulating region is a thermoplastic resin and is configured with a resin having a melting point substantially the same as a melting point of a resin constituting the board main body. By being configured with such a resin, it is easy to perform the molding of the insulating region simultaneously with the molding of the board main body. For this reason, it is possible to perform the molding of the passive devices such as capacitors and inductors in the board simultaneously with the molding of the board.

The functional filler is not particularly limited, but may be, for example, magnetic filler or dielectric filler. By using the magnetic filler, the inductor can be easily manufactured inside the board, so that it is easy to reduce the thickness of the device-embedded board. By using the dielectric filler, the capacitor can be easily manufactured inside the board, so that it is easy to reduce the thickness of the device-embedded board.

The board main body may have at least one insulating layer. The board main body may be used as an device-embedded board having a single insulating layer or may be used as an device-embedded board of a multiple-layer-stacked board type in which a plurality of insulating layers are stacked.

Preferably, a through-hole electrode penetrating the insulating layer is provided inside the board main body. Since the device-embedded board includes the through-hole electrode, it is possible to implement three-dimensional circuit connection for connecting devices and circuits.

Preferably, the insulating layer and the insulating region are simultaneously formed by hot-pressing an insulating powder. By being formed simultaneously, it becomes easy to manufacture the device-embedded board. In addition, preferably, a resin constituting the board main body is at least one selected from a liquid crystal polymer and fluororesin.

A method of manufacturing an device-embedded board according to a first aspect of the invention includes:
  forming a conductor film having a predetermined pattern on a surface of a support board;
  disposing a raw material powder by applying functional filler and a mixing resin powder on a portion of the conductor film;
  applying an insulating layer resin powder for forming an insulating layer on the conductor film on which the raw material powder is disposed; and
  forming a board unit by hot-pressing the insulating layer resin powder together with the mixing resin powder.

In addition, the functional filler and the mixing resin powder may be applied separately, but preferably, the functional filler and the mixing resin powder are mixed in advance and applied as a mixing powder (raw material powder). This case is good in dispersibility and sheet shape retention (wetting/permeability). For example, it is possible to apply only the functional filler, and then, to apply the insulating resin powder from the upper portion.

According to the method of manufacturing the device-embedded board according to the first aspect of the invention, it is possible to easily manufacture even an device-embedded board having a single insulating layer.

A method of manufacturing an device-embedded board according to a second aspect of the invention includes:
  forming a first conductor film having a first predetermined pattern on a surface of the first support board;

forming a first conductor post to be a first through-hole electrode on a portion of the first conductor film;

disposing a raw material powder by applying functional filler and a mixing resin powder on another portion of the first conductor film;

applying a first insulating layer resin powder for forming a first insulating layer on the first conductor film on which the raw material powder is disposed;

forming a first board unit by performing first hot-pressing on the first insulating layer resin powder together with the mixing resin powder;

forming a second conductor film having a second predetermined pattern on a surface of a second support board;

forming a second conductor post to be a second through-hole electrode on a portion of the second conductor film;

applying a second insulating layer resin powder for forming a second insulating layer on the second conductor film on which the second conductor post is formed;

forming a second board unit by performing second hot-pressing on the second insulating layer resin powder; and making a stacked body including at least the first board unit and the second board unit by collectively stacking, hot-pressing and bonding.

According to the method of manufacturing the device-embedded board according to the second aspect of the invention, it is possible to easily manufacture even an device-embedded board having multiple insulating layers.

Preferably, the method of manufacturing the device-embedded board according to the second aspect of the invention further includes:

forming a conductor connection film on a top surface of the first conductor post and/or the second conductor post, in which, when the stacked body including the first board unit and the second board unit is made by hot-pressing and bonding, the conductor connection film is simultaneously connected to a conductor film formed on a lower surface of another board unit stacked on the first board unit and/or the second board unit.

With such a configuration, it is possible to simultaneously perform the bonding between the resins constituting the board unit and the connection between the conductor films of the board units adjacent to each other in the stacking direction, so that it becomes easy to manufacture the device-embedded board.

Preferably, the first insulating layer resin powder, the second insulating layer resin powder, and the mixing resin powder have substantially the same resin melting point, a connection film melting point of the conductor connection film is lower than a conductor film melting point of the conductor film, and a temperature at the time of the collective stacking hot-pressing is a temperature equal to or lower than the resin melting point and higher than the connection film melting point.

With such a configuration, it is possible to simultaneously perform the bonding between the resins constituting the board unit and the connection between the conductor films of the board units adjacent to each other in the stacking direction, so that it becomes easy to manufacture the device-embedded board.

Preferably, a temperature at the time of the first hot-pressing is higher than a melting point of the first insulating layer resin powder and lower than a thermal decomposition temperature, and higher than the melting point of the mixing resin powder and lower than the thermal decomposition temperature, and a temperature at the time of the second hot-pressing is higher than a melting point of the second insulating layer resin powder and lower than the thermal decomposition temperature.

With such a configuration, a device such as a capacitor or an inductor can be formed, and an insulating layer can also be formed simultaneously.

Preferably, the insulating layer resin powder is at least one selected from a liquid crystal polymer and fluororesin. In addition, preferably, the application of the insulating layer resin powder and the application of the functional filler and the mixing resin powder are performed by an electrostatic printing method.

The device-embedded board according to the invention can be manufactured by any one of the above-described methods of manufacturing the device-embedded board.

DETAILED DESCRIPTION OF THE PREFERRED EMBODIMENTS

Figure 1A:
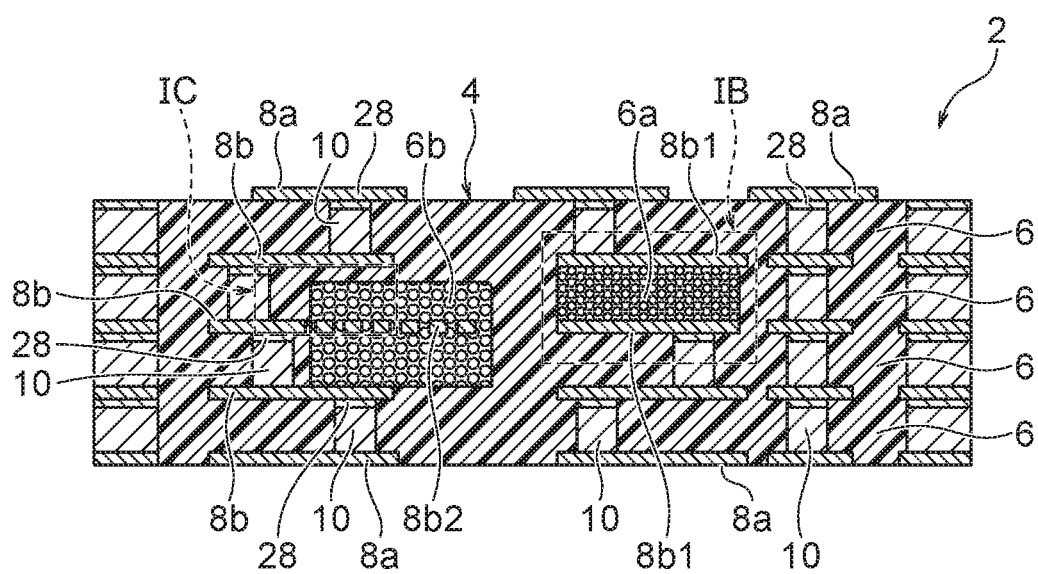
FIG. 1A is a schematic cross-sectional view of a device-embedded board according to one embodiment of the invention.
Figure 1A:
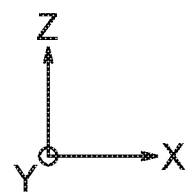

Hereinafter, the invention will be described with reference to embodiments illustrated in the drawings.

First Embodiment

As illustrated in FIG. 1A, a device-embedded board 2 according to one embodiment of the invention has a board main body 4. The board main body 4 has a plurality of insulating layers 6 stacked in a Z-axis direction. An intermediate wiring layer 8b as a conductor wiring layer is formed in a predetermined pattern in an X-axis direction and a Y-axis direction between the insulating layers 6 adjacent to each other in a stacking direction. In addition, a surface wiring layer 8a as a conductor wiring layer is formed in a predetermined pattern in the X-axis direction and the Y-axis direction on an outer surface of the insulating layer 6 located on the outermost side in the stacking direction.

In addition, in the drawings, the Z-axis coincides with the stacking direction of the insulating layers, and the X-axis and the Y-axis are substantially parallel to a plane in which the surface wiring layer 8a and the intermediate wiring layer 8b extend. The X, Y, and Z axes are substantially perpendicular to each other.

As illustrated in FIG. 1A, in order to connect the surface wiring layer 8a and the intermediate wiring layer 8b (electrically/hereinafter, unless otherwise specified) or to connect the intermediate wiring layers 8b located in different layers to each other, through-holes penetrating in the Z-axis direction are formed in each insulating layer 6, and a through-hole electrode 10 is buried in the through-holes.

Each insulating layer 6 is preferably configured with a thermoplastic resin and is not particularly limited, but from the viewpoint of high frequency characteristics (dielectric constant, dielectric loss tangent), low water absorption, heat resistance (reflow resistance characteristics), and the like, the insulating layer 6 is preferable configured with at least one selected from a liquid crystal polymer (LCP) such as a crystalline polyester and fluororesin.

The surface wiring layer 8a and the intermediate wiring layer 8b are not particularly limited as long as the surface wiring layer 8a and the intermediate wiring layer 8b have conductivity and can be easily patterned, and the surface wiring layer 8a and the intermediate wiring layer 8b are configured with Cu, Ni, Al, Ti, Fe, Ag, Au, alloys thereof, or the like. The through-hole electrode 10 is also configured with the same metal (including an alloy) as the surface wiring layer 8a or the intermediate wiring layer 8b, but the through-hole electrode 10 is not necessarily required to be configured with the same. The surface wiring layer 8a and the intermediate wiring layer 8b are also configured with the same metal, but the surface wiring layer 8a and the intermediate wiring layer 8b are not necessarily to be required to be configured with the same.

In addition, a conductor connection film 28 is preferably interposed between the through-hole electrode 10 and the intermediate wiring layer 8b or between the through-hole electrode 10 and the surface wiring layer 8a. The conductor connection film 28 is preferably configured with a metal having a melting point lower than the melting point of the metal constituting the surface wiring layer 8a and the intermediate wiring layer 8b or the through-hole electrode 10. The melting point of the metal constituting the conductor connection film 28 is preferably lower than a temperature at which the insulating layer 6 is fused in the stacking direction by hot-pressing. At the time of the hot-pressing, the through-hole electrode 10 can be connected to an intermediate wiring layer 8b or the surface wiring layer 8a through the conductor connection film 28 simultaneously.

The metal constituting the conductor connection film 28 is not particularly limited, but Sn, Ag, Sn—Ag, Cu—Ag, Sn—Cu, or the like is exemplified. The melting point of the metal constituting the conductor connection film 28 is preferably slightly lower than the melting point (softening temperature) of the resin constituting the insulating layer 6, more preferably lower by about 10 to 50° C. than the melting point of the resin constituting the insulating layer 6, more preferably lower by about 20 to 40° C. than the melting point of the resin constituting the insulating layer 6.

In the present embodiment, the thickness of each insulating layer 6 in the Z-axis direction is not particularly limited, but the thickness is preferably 30 to 100 μm. The thickness of each insulating layer 6 corresponds to the height of each through-hole electrode 10 in the Z-axis direction. The thicknesses of the surface wiring layer 8a and the intermediate wiring layer 8b are not particularly limited, but the thicknesses are preferably 5 to 20 μm. The thickness of the conductor connection film 28 is not particularly limited, but the thickness is preferably from 0.2 to 5.0 μm.

In addition, the pattern line width of each surface wiring layer 8a or each intermediate wiring layer 8b is not particularly limited, but the pattern line width is preferably 20 μm or less, more preferably 10 μm or less, and particularly preferably 7 μm or less. The outer diameter of the through-hole electrode 10 is also not particularly limited, and usually, it is possible to manufacture the through-hole electrode with an outer diameter it, of 100 to 50 μm and 50 μm or less.

As illustrated in FIG. 1A, in the present embodiment, a portion of the intermediate wiring layer 8b functions as a capacitor electrode layer 8b1, and another portion of the intermediate wiring layer 8b functions as an inductor conductor layer 8b2.

A pair of the capacitor electrode layers 8b1 facing in the Z-axis direction with one or a plurality of the insulating layers 6 interposed therebetween have substantially the same area on a plane including the X-axis and the Y-axis, and a space therebetween becomes a capacitor region 6a as an insulating region. The pair of capacitor electrode layers 8b1 and the capacitor region 6a constitute a capacitor device. The capacitor device is embedded inside the device-embedded board 2 illustrated in FIG. 1A. In addition, the pair of capacitor electrode layers 8b1 facing in the Z-axis direction do not necessarily have the same areas in the planes including the X-axis and the Y-axis.

For example, each of the capacitor electrode layers 8b1 is connected to the intermediate wiring layer 8b located on a different layer through the through-hole electrode 10 or connected to the intermediate wiring layer 8b located on the same layer by a wiring pattern.

Figure 1B:
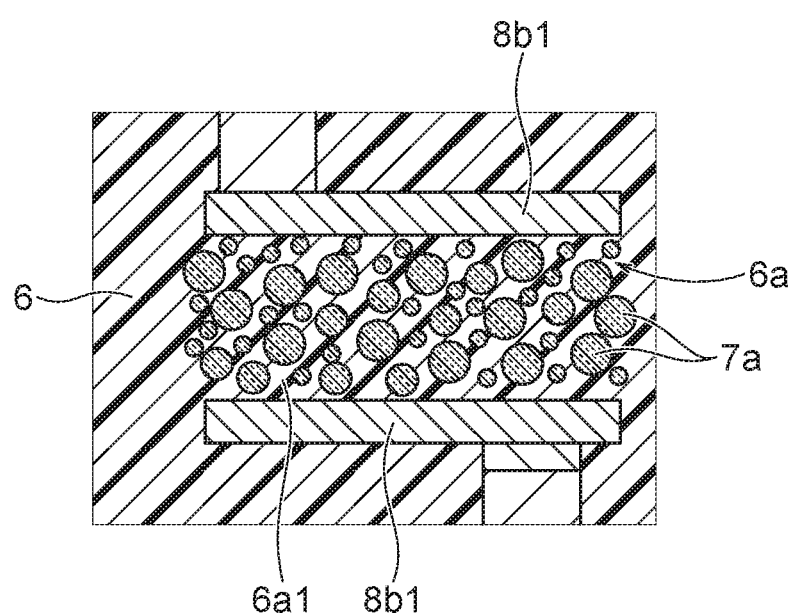
FIG. 1B is an enlarged schematic cross-sectional view of a main portion of a capacitor region illustrated in FIG. 1A.

As illustrated in FIG. 1B, in the capacitor region 6a, dielectric filler 7a as functional filler is densely dispersed inside a resin 6a1 existing inside the capacitor region 6a.

The resin 6a1 existing inside the capacitor region 6a is preferably the same as the resin constituting the insulating layer 6, but the resins are not necessarily required to be the same. However, preferably, the resin constituting the insulating layer 6 and the resin 6a1 existing inside the capacitor region 6a located between the pair of capacitor electrode layers 8b1 have substantially the same melting point. The phrase "substantially the same" denotes that an error of ±15° C. is regarded as substantially the same.

The dielectric filler $7a$ existing in the capacitor region $6a$ is not particularly limited, but paraelectric ceramic powders and ferroelectric ceramic powders such as barium titanate and strontium titanate are exemplified. Specifically, as the dielectric filler $7a$, for example, $Mg_2SiO_4$, $Mg_2TiO_4$, $MgTiO_3$, $ZnTiO_3$, $Zn_2TiO_4$, $CaTiO_3$, $SrZrO_3$, $BaTi_2O_5$, $Ba_2Ti_9O_{20}$, $Ba_2(Ti, Sn)_9O_{20}$, $ZrTiO_4$, $(Zr, Sn)TiO_4$, $BaNd_2Ti_5O_{14}$, $BaNd_2Ti_4O_{12}$, $BaSm_2TiO_{14}$, BaO—CaO—$Nd_2O_3$—$TiO_2$ series, BaO—SrO—$Nd_2O_3$—$TiO_2$ series, $Bi_2O_3$—BaO—$Nd_2O_3$—$TiO_2$ series, PbO—BaO—$Nd_2O_3$—$TiO_2$ series, $(Bi_2O_3, PbO)$—BaO—$Nd_2O_3$—$TiO_2$ series, $La_2Ti_2O_7$, $Nd_2Ti_2O_7$, (Li, Sm)$TiO_3$, $Ba(Mg_{1/3}Nd_{2/3})O_3$, $Ba(Zn_{1/3}Ta_{2/3})O_3$, $Ba(Zn_{1/3}Nd_{2/3})O_3$, $Sr(Zn_{1/3}Nd_{2/3})O_3$, or the like is exemplified.

The shape of the filler is preferably a true spherical shape, the particle size is preferably more than 0 µm and is 100 µm or less, and the average particle size is preferably 0.1 to 20 µm, more preferably 0.8 to 5 µm. The volume density (volume of the dielectric filler $7a$ per unit volume) of the dielectric filler $7a$ in the capacitor region $6a$ is preferably 5 to 70%. In addition, although the average particle size of the filler is optimally 0.8 to 5 µm, the average particle size is preferably a half or less of the thickness of the insulating layer 6 from the viewpoint of the flatness and the insulating property of the pressed sheet.

Figure 1C:
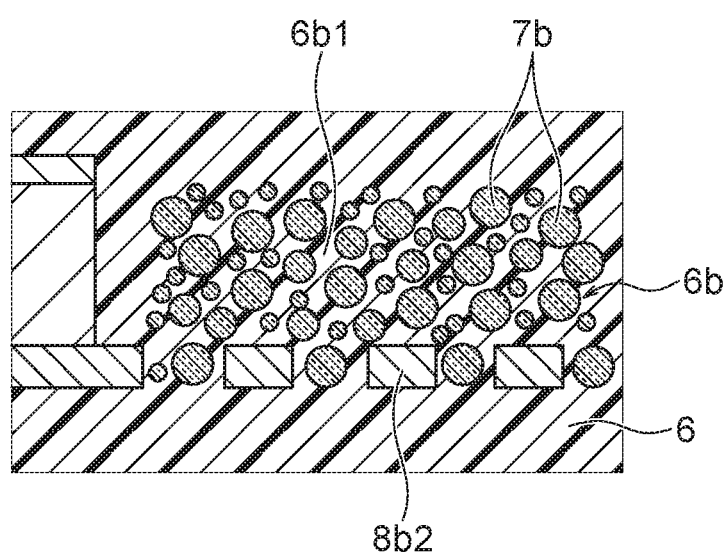
FIG. 1C is an enlarged schematic cross-sectional view of a main portion of an inductor region illustrated in FIG. 1A.

As illustrated in FIG. 1C, an inductor conductor layer $8b2$ is formed, for example, so as to be continuously connected to the intermediate wiring layer $8b$ located on the same layer and is patterned into a spiral coil shape when viewed from the Z-axis. In an inductor region $6b$ located at least around one side in the Z-axis direction of the inductor conductor layer $8b2$, magnetic filler $7b$ as functional filler is densely dispersed inside a resin $6b1$ existing inside the inductor region $6b$.

The inductor conductor layer $8b2$ and the inductor region $6b$ constitute an inductor device. This inductor device is embedded inside the device-embedded board 2 illustrated in FIG. 1A.

The resin $6b1$ existing inside the inductor region $6b$ is preferably the same as the resin constituting the insulating layer 6, but the resins are not necessarily required to be configured with the same. However, preferably, the resin constituting the insulating layer 6 and the resin $6b1$ existing inside the inductor region $6b$ located around the inductor conductor layer $8b2$ have substantially the same melting point.

The magnetic filler $7b$ existing in the inductor region $6b$ is not particularly limited, but a metal magnetic component coated with insulation, a ferrite powder, or the like is exemplified. As the metal magnetic component, for example, carbonyl iron, an iron-based alloy such as an iron-silicon alloy, an iron-aluminum-silicon alloy, or an iron-nickel alloy, or the like is exemplified, and an iron-based amorphous alloy, a cobalt-based amorphous alloy, or the like may be employed. In addition, as the ferrite powder, Mn—Zn series, Ni—Zn series, Mn—Mg—Zn series, or the like is exemplified. The shape, particle size, volume density, and the like of the magnetic filler $7b$ are the same as those of the dielectric filler $7a$.

Next, a method of manufacturing the device-embedded board 2 having a multilayer structure illustrated in FIG. 1A will be described in detail.

Figure 2:
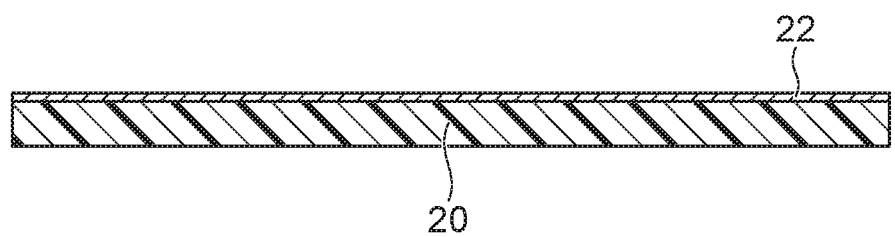
FIG. 2 is a schematic cross-sectional view illustrating a process of manufacturing the device-embedded board illustrated in FIG. 1A.
Figure 2:
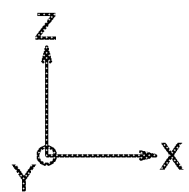

First, as illustrated in FIG. 2, a support board 20 is prepared. The support board 20 is not particularly limited, but a metal plate such as a SUS plate, a resin sheet such as a polyimide film, a high heat-resistant board such as a glass epoxy board and others, or the like is exemplified. The support board 20 may be any material that can be handled and has heat resistance for withstanding the pressing temperature (melting temperature) of the insulating layer configured with a thermoplastic resin.

The underlying conductor film 22 is preferably formed on the surface of the support board 20 in advance, but the underlying conductor film 22 prepared separately from the support board 20 may be attached to the surface of the support board 20. The underlying conductor film 22 is a film serving as a seed for forming a plating film in a later process and is configured with, for example, a metal film of Cu, a copper alloy, or the like.

The underlying conductor film 22 may be formed on the surface of the support board 20 by sputtering or the like, but the underlying conductor film 22 is preferably formed by a method that can be peeled off later with the support board. For example, a thermoplastic polyimide board adhered with an ultra-thin copper foil adhered with a carrier is used as a support board 20 to improve handling properties. However, an ultra-thin copper foil itself adhered with a carrier may be used as a support board 20 adhered with underlying conductor film 22.

Figure 3:
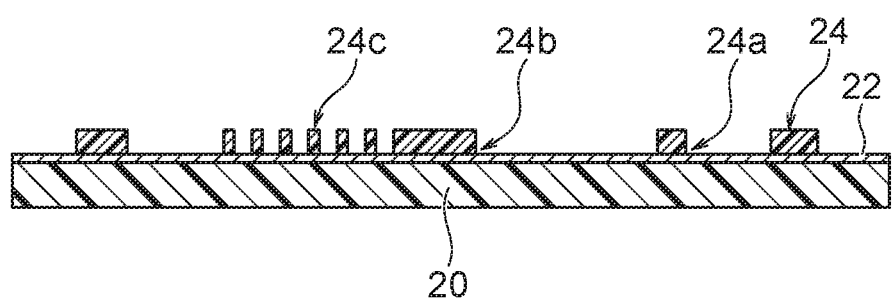
FIG. 3 is a schematic cross-sectional view illustrating a process subsequent to that of FIG. 2.
Figure 3:
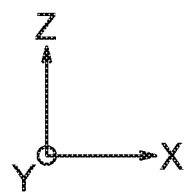

Next, as illustrated in FIG. 3, a resist film 24 is formed in a predetermined pattern on the underlying conductor film 22 of the support board 20. The pattern of the resist film 24 may include one or more of, for example, a pattern $24a$ for forming a conductor wiring layer, a pattern $24b$ for forming a capacitor electrode layer, a pattern $24c$ for forming an inductor conductor layer, and the like.

Figure 4:
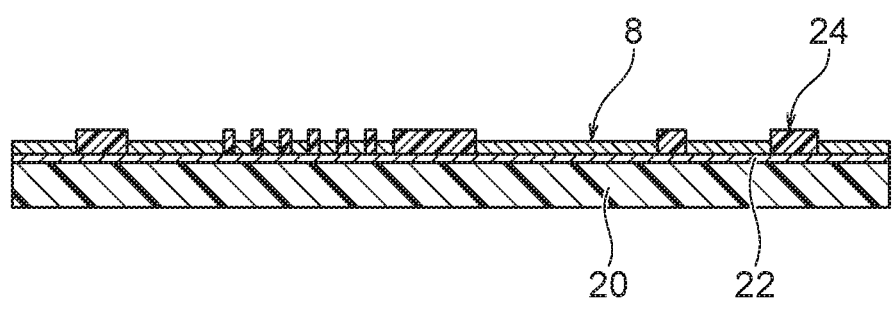
FIG. 4 is a schematic cross-sectional view illustrating a process subsequent to that of FIG. 3.
Figure 4:
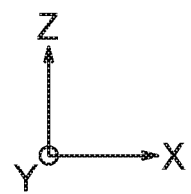

Next, as illustrated in FIG. 4, the wiring conductor film 8 is formed on the surface of the underlying conductor film 22 not covered with the resist film 24 by using the resist film 24 having a predetermined pattern, for example, by a plating method using the underlying conductor film 22 as a seed. The wiring conductor film 8 is a portion that becomes the intermediate wiring layer $8b$ illustrated in FIG. 1A or the surface wiring layer $8a$ illustrated in FIG. 1D and is formed, for example, by electrolytic copper plating.

Figure 5:
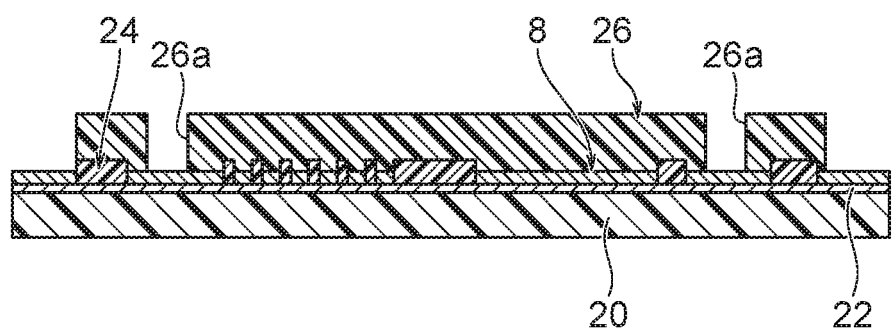
FIG. 5 is a schematic cross-sectional view illustrating a process subsequent to that of FIG. 4.
Figure 5:
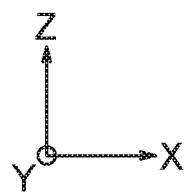

Next, as illustrated in FIG. 5, a resist film 26 is formed in a predetermined pattern on the surface of the wiring conductor film 8 in a state where the resist film 24 remains. Through holes $26a$ are formed on the resist film 26 in a pattern for forming the through-hole electrode 10 illustrated in FIGS. 1A and 1D. In addition, after removing the resist film 24 illustrated in FIG. 5, a resist film 26 may be formed in a predetermined pattern.

Figure 6:
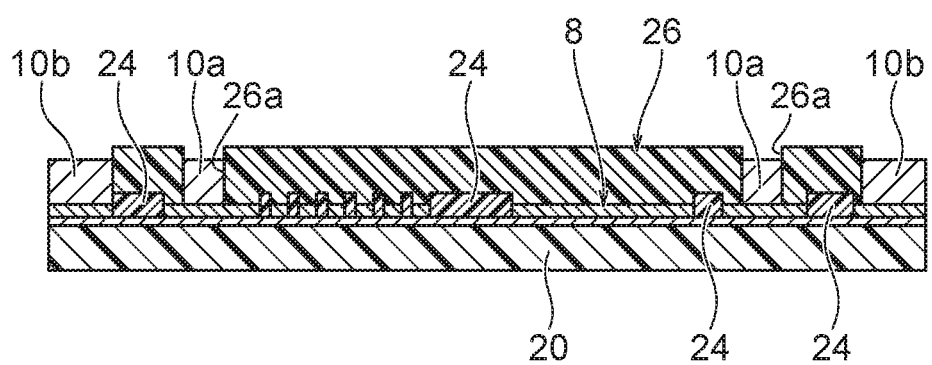
FIG. 6 is a schematic cross-sectional view illustrating a process subsequent to that of FIG. 5.

Next, as illustrated in FIG. 6, a conductor post $10a$ and a frame body $10b$ are formed on the surface of the wiring conductor film 8 not covered with the resist film 26, for example, by an electrolytic copper plating method. The conductor post $10a$ is a portion that becomes the through-hole electrode 10 in FIGS. 1A and 1D.

In addition, the frame body $10b$ is formed along the outer peripheral frame of the support board 20, and when the raw material powder for forming the insulating layer 6 is applied on the wiring conductor film 8 in the following process, the frame body $10b$ is used to prevent the raw material powder from protruding outside. The frame body $10b$ may be removed from a final product or may remain. The frame body $10b$ may not necessarily be formed simultaneously with the conductor post $10a$ in the process illustrated in FIG. 6. In other processes, the frame body $10b$ may be attached to the outer periphery of the support board 20 in a process unrelated to the conductor post $10a$.

Figure 7:
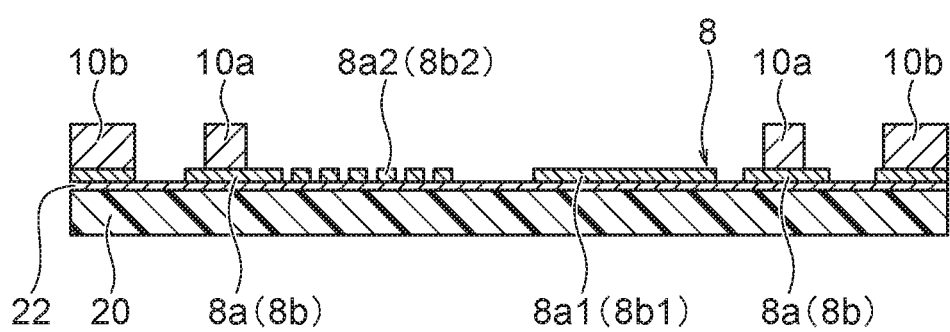
FIG. 7 is a schematic cross-sectional view illustrating a process subsequent to that of FIG. 6.
Figure 7:
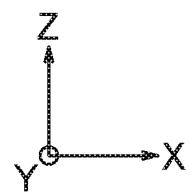

Next, as illustrated in FIG. 7, the resist films 24 and 26 illustrated in FIG. 6 are removed. As a result, the wiring conductor film 8 having a predetermined pattern remains on the surface of the underlying conductor film 22. A portion of the wiring conductor film 8 becomes the surface wiring layer 8a or the intermediate wiring layer 8b illustrated in FIG. 1A or 1D, another portion becomes a capacitor electrode layer 8a1 or 8b1 illustrated in FIG. 1A or FIG. 1D, and still another portion becomes an inductor conductor layer 8a2 or 8b2 illustrated in FIG. 1A or 1D. The conductor post 10a is connected on the surface wiring layer 8a or the intermediate wiring layer 8b to remain.

In addition, in the present embodiment, the outer diameter of the conductor post 10a is preferably smaller than the line width of the wiring layer 8a or 8b. As described above, the line width of the wiring layer 8a or 8b can be preferably 10 μm or less, more preferably 7 μm or less. The outer diameter of the conductor post 10a is not particularly limited as long as the electric resistance does not become too high. In addition, in many cases, the outer diameter of the conductor post 10a is larger than the minimum wiring portion of the pattern.

Figure 8:
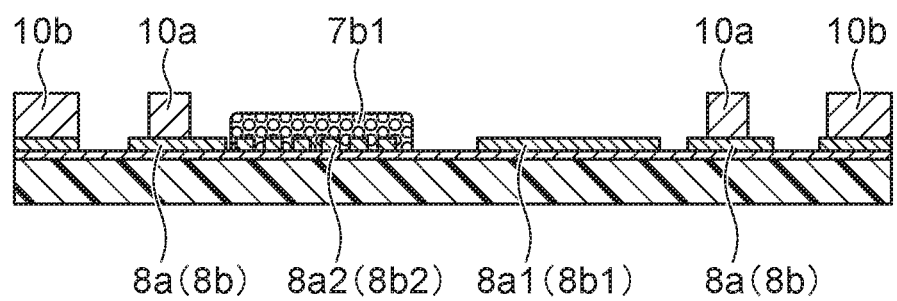
FIG. 8 is a schematic cross-sectional view illustrating a process subsequent to that of FIG. 7.
Figure 8:
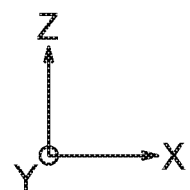

Next, in the present embodiment, as illustrated in FIG. 8, a second raw material powder 7b1 is applied only to the vicinity of the inductor conductor layer 8a2 or 8b2. The second raw material powder 7b1 can be applied only to the vicinity of the inductor conductor layer 8a2 or 8b2 by an application method such as screen printing, electrostatic printing, nozzle spraying, or dispensing method. More preferably, it is possible to perform application and fixing only at a predetermined position by applying by an electrostatic printing method, and it is possible to perform application without mixing with an insulating layer resin powder to be applied later.

The second raw material powder 7b1 includes magnetic filler 7b (refer to FIG. 1C) as functional filler and a resin powder (mixing resin powder) constituting the resin 6b1 of the inductor region 6b, and these are mixed. In the present embodiment, the resin powder constituting the resin 6b1 is the same as the resin powder constituting the insulating layer 6, and for example, an LCP powder or fluororesin polymer powder is used. The mixing ratio of the resin powder to the magnetic filler 7b is preferably 0 to 50 wt %, more preferably 10 to 40 wt % when the total second raw material powder 7b1 is set to 100%.

The average particle size of the resin powder constituting the resin 6b1 illustrated in FIG. 1B is the same as the average particle size of the magnetic filler 7b (refer to FIG. 1C), but the average particle size of the resin powder may be different from the average particle size of the magnetic filler 7b (refer to FIG. 1C).

Figure 9:
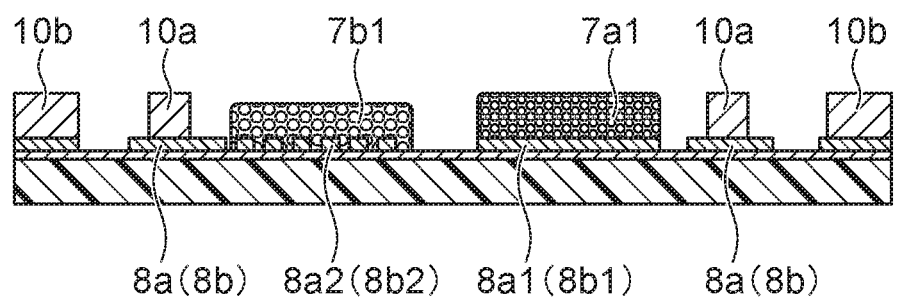
FIG. 9 is a schematic cross-sectional view illustrating a process subsequent to that of FIG. 8.
Figure 9:
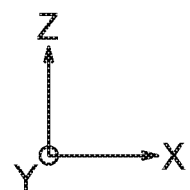

Next, in the present embodiment, as illustrated in FIG. 9, a first raw material powder 7a1 is applied only to the vicinity of the capacitor electrode layer 8a1 or 8b1. The first raw material powder 7a1 may be applied only to the vicinity of the capacitor electrode layer 8a1 or 8b1 by the same application method as that of the second raw material powder 7b1.

The first raw material powder includes dielectric filler 7a (refer to FIG. 1B) as functional filler and a resin powder (mixing resin powder) constituting the resin 6a1 of the capacitor region 6a, and these are mixed. In the present embodiment, the resin powder constituting the resin 6a1 is the same as the resin powder constituting the insulating layer 6, and for example, an LCP powder or fluororesin polymer powder is used.

The mixing ratio of the resin powder to the dielectric filler 7a in the first raw material powder is the same as that in the case of the second raw material powder 7b1. In addition, the average particle size of the resin powder constituting the resin 6a1 illustrated in FIG. 1B is the same as the average particle size of the dielectric filler 7a (refer to FIG. 1B), but the average particle size of the resin powder may be different from the average particle size of the dielectric filler 7a (refer to FIG. 1B).

In addition, the order of the application of the second raw material powder 7b1 and the application of the first raw material powder 7a1 illustrated in FIG. 9 may be reversed. Although there is no limitation on the application method, even the first raw material powder 7a1 or the second raw material powder 7b1 containing no solvent or the like may be easily applied only to a predetermined portion in a fixed state without re-scattering, in particular, by using electrostatic printing using a screen plate.

Figure 10:
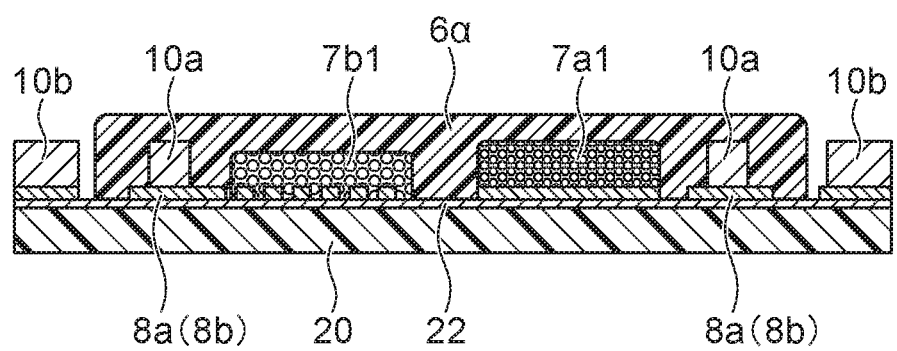
FIG. 10 is a schematic cross-sectional view illustrating a process subsequent to that of FIG. 9.
Figure 10:
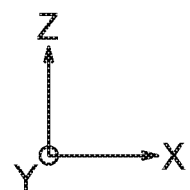

Next, as illustrated in FIG. 10, an insulating layer resin powder 6a is applied to the inside of the frame body 10b so that the surface of the underlying conductor film 22 of the support board 20, the surface of the surface wiring layer 8a or the intermediate wiring layer 8b, and the surfaces of the first raw material powder 7a1 and the second raw material powder are covered. The method for the application is the same as the method for the application of the first raw material powder 7a1 or the second raw material powder 7b1, and for example, an electrostatic printing method is used.

Figure 1D:
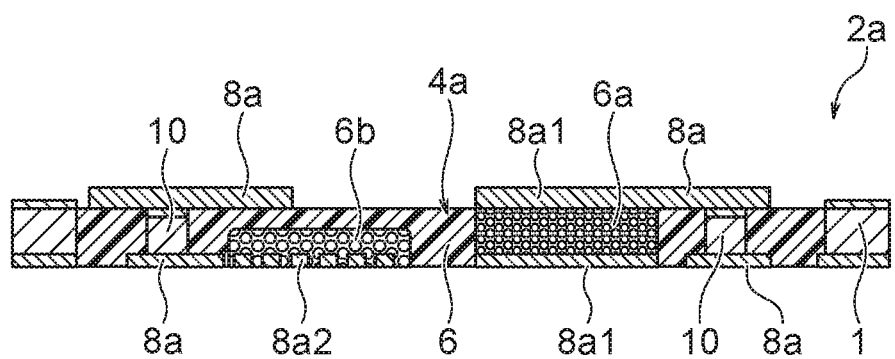
FIG. 1D is a schematic cross-sectional view of a device-embedded board according to another embodiment of the invention.

The insulating layer resin powder 6a is a resin powder for forming the insulating layer 6 illustrated in FIGS. 1A and 1D and is preferably a thermoplastic resin powder having a melting point of 230 to 360° C., for example, at least one selected from a liquid crystal polymer (LCP) powder and fluororesin powder is preferred from the viewpoint of high frequency characteristics such as a low dielectric constant or a low dielectric loss tangent and low water absorption. The LCP powder or fluororesin polymer powder is preferably a spherical powder having a particle size of 1 to 60 μm, and in the present embodiment, as the resin powder a, a power being made of the same material as the resin powder contained in the first raw material powder 7a1 and the second raw material powder 7b1 and having the same particle size range is used.

The insulating layer resin powder 6a may contain other components as necessary in addition to the LCP resin powder or fluororesin polymer powder.

Figure 11:
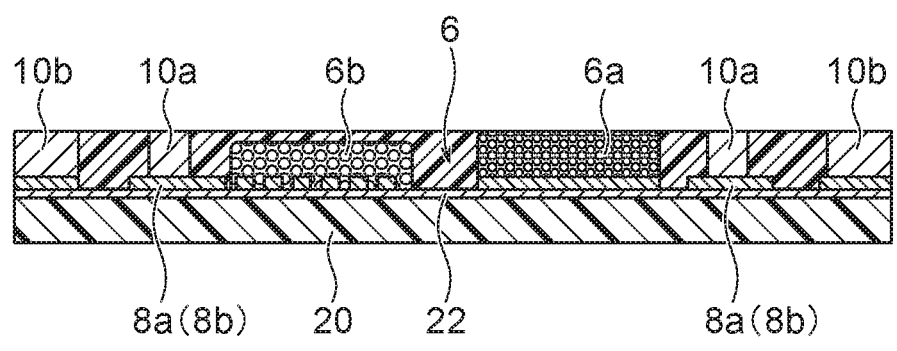
FIG. 11 is a schematic cross-sectional view illustrating a process subsequent to that of FIG. 10.
Figure 11:
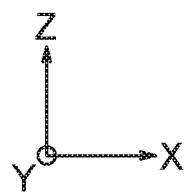

Next, the insulating layer resin powder 6a raised above the frame body 10b is hot-pressed and melted from the upper portion in the Z-axis to form a sheet-like insulating layer 6 as illustrated in FIG. 11. The temperature at the time of the hot-pressing is preferably a temperature equal to or higher than the melting point of the insulating layer resin powder 6a, a temperature equal to or lower than the thermal decomposition temperature of the insulating layer resin powder 6a, and more preferably a temperature by about 10 to 50° C. higher than the melting point of the insulating layer resin powder 6a. In addition, the pressure at the time of the hot-pressing is not particularly limited but may be a pressure at which the sheet-like insulating layer 6 having a predetermined thickness can be molded from the insulating layer resin powder 6a inside the frame body 10b.

At the time of the hot-pressing for molding the sheet-like insulating layer 6, the resin powder contained in the raw material powders 7a1 and 7b1 illustrated in FIG. 10 is also melted and formed into a sheet, and as illustrated in FIG. 6b, the capacitor region 6a and the inductor region 6b are respectively formed.

In the capacitor region 6a, as illustrated in FIG. 1B, dielectric filler 7a are densely dispersed inside the sheet-like resin 6a1 integrated with the insulating layer 6. In the inductor region 6b illustrated in FIG. 11, as illustrated in FIG. 1C, magnetic filler 7b are densely dispersed inside the sheet-like resin 6b1 integrated with the insulating layer 6.

In addition, as illustrated in FIG. 11, if necessary, in order to planarize the upper surface of the insulating layer 6, to remove a surplus insulating layer 6 attached to the top of the conductor post 10a and the top of the insulating region 6a, and the like, a polishing process may be performed on the upper surface of the insulating layer 6. The polishing method is not particularly limited, but a chemical mechanical polishing (CMP) method, a grindstone polishing method, a fly cut method, or the like is exemplified.

Figure 12:
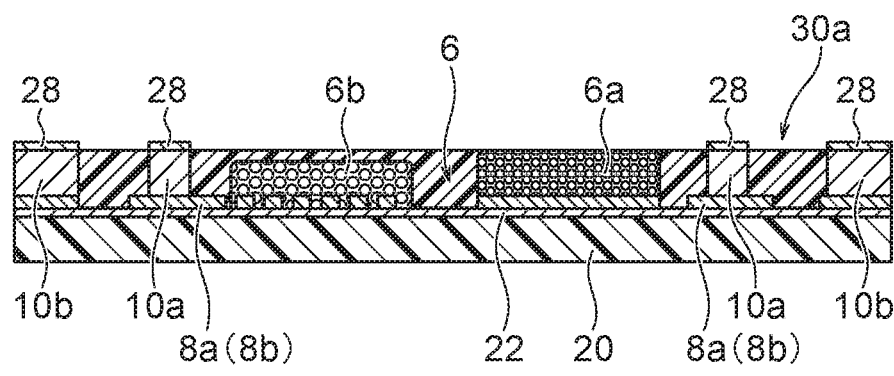
FIG. 12 is a schematic cross-sectional view illustrating a process subsequent to that of FIG. 11.
Figure 12:
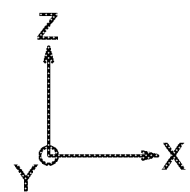

Next, as illustrated in FIG. 12, a board unit 30a can be formed by forming the conductor connection film 28 on the top of the conductor post 10a. In addition, the conductor connection film 28 may be formed on the upper portion of the frame body 10b, but the conductor connection film 28 may not be formed. As the method for forming the conductor connection film 28 on the top of the conductor post, an electrolytic plating method, an electroless plating method, a sputtering method, or the like is exemplified.

The conductor connection film 28 is configured with a metal having a melting point lower than the melting point of the metal constituting the conductor post 10a and the surface wiring layer 8a (or the intermediate wiring layer 8b).

Figure 13A:
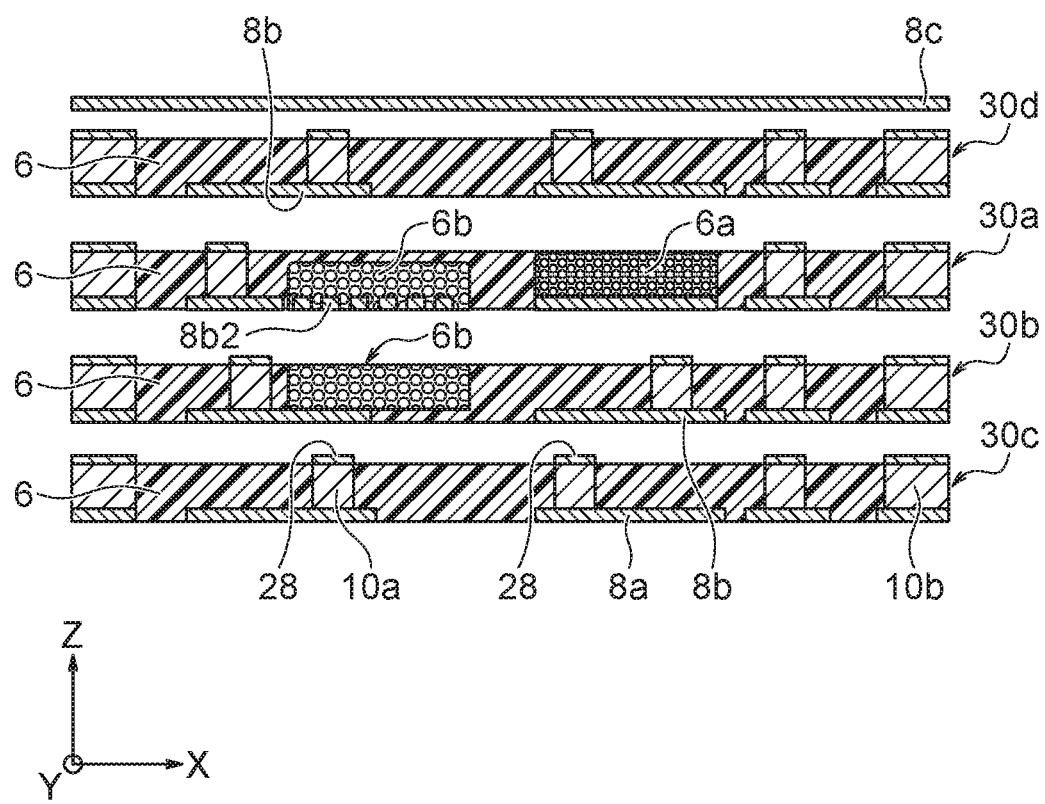
FIG. 13A is a schematic cross-sectional view illustrating a process subsequent to that of FIG. 12.

In the same processes as the manufacturing processes illustrated in FIGS. 2 to 12 described above, for example, board units 30b to 30d illustrated in FIG. 13A can be manufactured in addition to the board unit 30a illustrated in FIG. 11. In addition, when the board units 30a to 30d are stacked and hot-pressed, the support board 20 and the underlying conductor film 22 illustrated in FIG. 12 are removed from the board units 30a to 30d.

As illustrated in FIG. 13A, in the board unit 30b, the capacitor region 6a is not formed inside the sheet-like insulating layer 6, but only the inductor region 6b is formed. The top of the inductor region 6b is exposed from the surface of the insulating layer 6 and can be in contact with the inductor conductor layer 8b2 of the insulating layer 6 stacked on the upper side in the Z-axis. In addition, in the board units 30c and 30d, the capacitor region 6a and the inductor region 6b are not formed, and only the conductor post 10a, the wiring layer 8a or 8b, and the frame body 10b are formed.

Figure 13B:
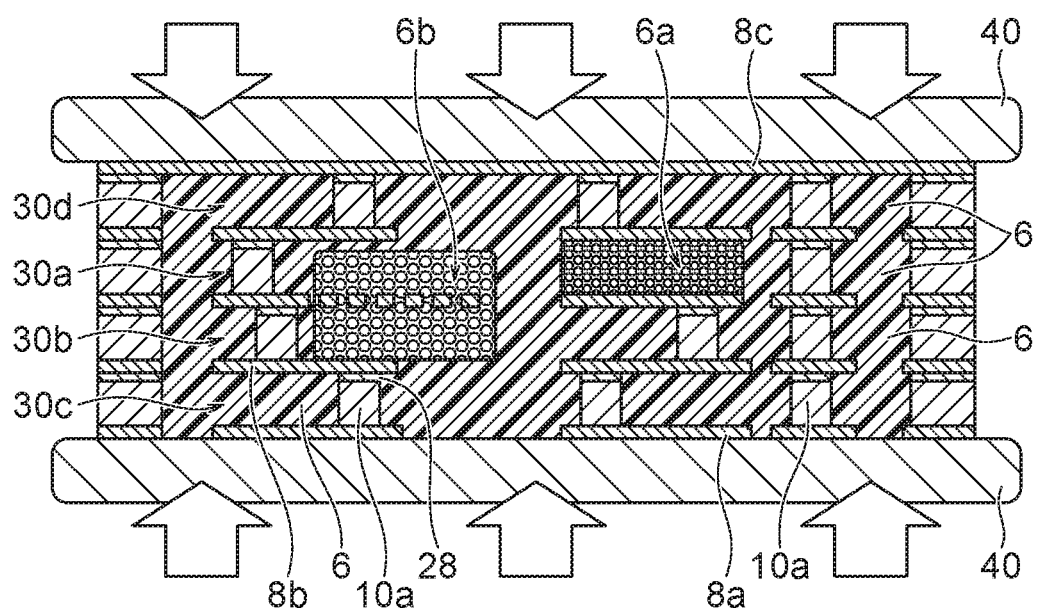
FIG. 13B is a schematic cross-sectional view illustrating a process subsequent to that of FIG. 13A.

As illustrated in FIG. 13B, the board units 30a to 30d together with a conductor foil 8c are hot-pressed (collectively stacked and hot-pressed) by a hot-pressing device 40. The conductor foil 8c is not particularly limited, but the conductor foil 8c is configured with the same metal as the metal constituting the wiring layers 8a and 8b, for example, a copper foil. The conductor foil 8c is stacked on the uppermost portion in the stacking direction and is patterned by etching or the like to become the surface wiring layer 8a illustrated in FIG. 1A.

At the time of collective stacking hot-pressing, the insulating layers 6 adjacent in the stacking direction are thermally fused, and by the conductor connection film 28 having a low melting point, the conductor post 10a and the intermediate wiring layer 8b are connected, and the conductor post 10a and the conductor foil 8c are connected. The temperature at the time of the collective stacking hot-pressing is preferably equal to or lower than the melting point of the resin constituting the insulating layer and is preferably higher than the melting point of the conductor connection film 28.

Thus, the device-embedded board 2 illustrated in FIG. 1A can be manufactured.

In the device-embedded board 2 according to the present embodiment illustrated in FIG. 1A, for example, a capacitor region 6a which is to be a portion of a capacitor and an inductor region 6b which is to be a portion of an inductor are formed together with the insulating layer 6. For this reason, for example, in the process of manufacturing a multilayer board, it is possible to simultaneously form the capacitor region 6a and/or the inductor region 6b that will be the device formation layer. For example, it is not necessary to manufacture passive devices such as capacitors or inductors separately from the multilayer board. Therefore, the task of burying the devices in the multilayer board is not required. Furthermore, since the devices are formed inside the board in the process of manufacturing the multilayer board, the thickness of the multilayer board can be reduced.

Furthermore, in the present embodiment, the resin contained in the capacitor region 6a and/or the inductor region 6b has a melting point substantially the same as the melting point of the resin of the insulating layer 6 constituting the board main body. With such a configuration, the capacitor region 6a and/or the inductor region 6b can be molded simultaneously with the molding of the board main body 4. As a result, simultaneously with the molding of the multilayer board, the molding of passive devices such as capacitors and inductors inside the multilayer board can also be performed simultaneously.

In addition, in the device-embedded board 2 according to the present embodiment, a through-hole electrode 10 penetrating the insulating layer 6 is provided inside the board main body 4. Since the device-embedded board 2 has the through-hole electrode 10, three-dimensional circuit connection for connecting devices such as capacitors to a circuit can be implemented.

Furthermore, in the present embodiment, the insulating layer 6 and the capacitor region 6a and/or the inductor region 6b are simultaneously formed by hot-pressing. By being simultaneously formed, it becomes easy to manufacture the device-embedded board 2.

Further, in the method of manufacturing the device-embedded board according to the present embodiment, as illustrated in FIG. 13B, heat-fusion bonding between the insulating layers 6 constituting the board units 30a to 30d and connection between the wiring layers 8a and 8b of the board units 30a to 30d adjacent to each other in the stacking direction and the conductor post 10a can be performed simultaneously. As a result, it becomes easy to manufacture the device-embedded board 2.

Furthermore, in the present embodiment, the melting point of the resin constituting the insulating layer 6, the melting point of the resin contained in the capacitor region 6a, and the melting point of the resin contained in the inductor region 6b are substantially the same. In addition, the melting point of the conductor connection film 28 is lower than the melting point of the wiring layer 8a or 8b, and the temperature at the time of the collective stacking hot-pressing is a temperature equal to or lower than the melting point of the resin of the insulating layer 6 and higher than the melting point of the conductor connection film 28.

With such a configuration, it becomes easy to simultaneously perform the bonding between the resins constituting the board units 30a to 30d and the connection between the wiring layers 8a and 8b of the board units 30a to 30d adjacent to each other in the stacking direction and the conductor post 10a.

Furthermore, the temperature at the time of hot-pressing for forming the sheet-like insulating layer 6 illustrated in FIG. 11 is higher than the melting point of the resin powder for forming the insulating layer 6 and lower than the thermal decomposition temperature, and the temperature at the time of hot-pressing is higher than the melting point of the resin contained in the region 6a or 6b and lower than the thermal decomposition temperature. With such a configuration, devices such as capacitors and inductors can be formed simultaneously with the formation of the insulating layer 6.

Second Embodiment

As illustrated in FIG. 1D, a device-embedded board 2a according to another embodiment of the invention is the same as and has the same functions and effects as the device-embedded board 2 according to the first embodiment except for the followings.

The device-embedded board 2a according to the present embodiment is a single-layer board configured with a board main body 4a having a single-layer insulating layer 6. Surface wiring layers 8a as conductor wiring layers are formed in a predetermined pattern in the X-axis direction and the Y-axis direction, respectively, on the upper and lower surfaces of the insulating layer 6. Further, a through hole penetrating in the Z-axis direction is formed in the insulating layer 6, and a through-hole electrode 10 is buried in the through hole.

In addition, in the insulating layer 6, a capacitor region 6a and an inductor region 6b are integrally formed. In the present embodiment, a portion of the surface wiring layer 8a also serves as the capacitor electrode layer 8a1, and another portion of the surface wiring layer 8a also serves as the inductor conductor layer 8a2.

Figure 14A:
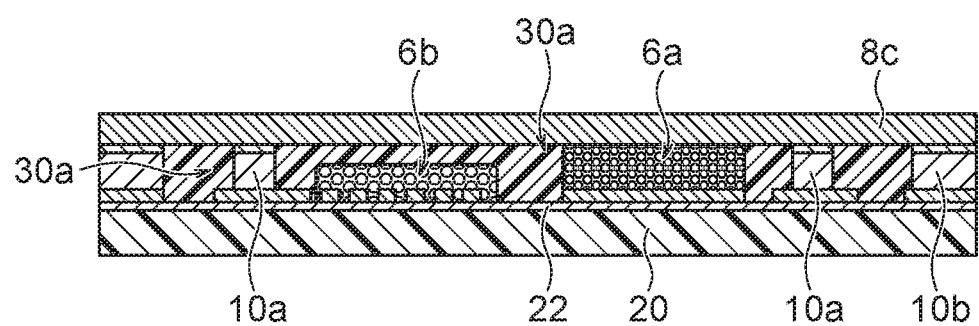
FIG. 14A is a schematic cross-sectional view illustrating a process of manufacturing the device-embedded board illustrated in FIG. 1D and illustrating a process subsequent to that of FIG. 12.

When the device-embedded board 2a according to the present embodiment is to be manufactured, the manufacturing processes illustrated in FIGS. 2 to 12 are the same as those of the first embodiment. In the present embodiment, from the manufacturing process illustrated in FIG. 12, as illustrated in FIG. 14A, the conductor foil 8c is repeatedly stacked on the upper surface of the single board unit 30a, and by hot-pressing from the Z-axis direction, the conductor foil 8c is bonded on the upper surface of the board unit 30a.

Figure 14B:
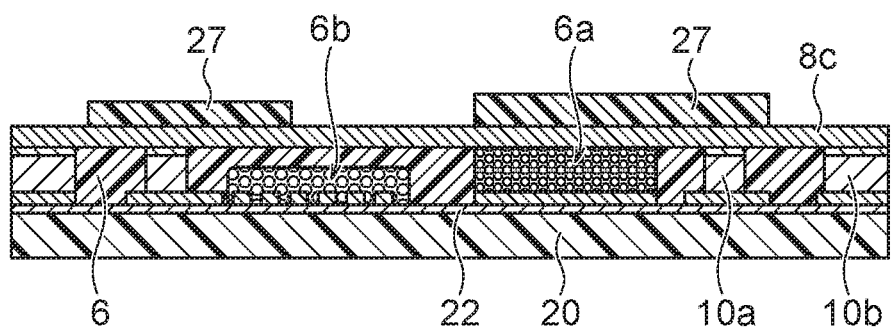
FIG. 14B is a schematic cross-sectional view illustrating a process subsequent to that of FIG. 14A.
Figure 14C:
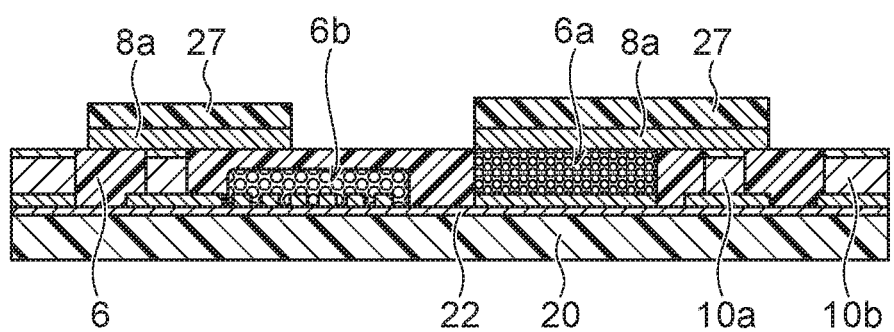
FIG. 14C is a schematic cross-sectional view illustrating a process subsequent to that of FIG. 14B.

As illustrated in FIGS. 14B and 14C, the conductor foil 8c is etched in a predetermined pattern by using the resist film 27 or the like to become the surface wiring layer 8a of the device-embedded board 2a illustrated in FIG. 1D. The resist film 27, the underlying conductor film 22, and the support board 20 illustrated in FIG. 14C are removed from the device-embedded board 2a of the final product illustrated in FIG. 1D. The frame body 10b may also be removed.

According to the method of manufacturing the device-embedded board 2a according to the present embodiment, even the device-embedded board 2a having a single-layer insulating layer 6 can be easily manufactured.

In addition, the invention is not limited to the embodiments described above, but the invention can be variously modified within the scope of the invention.

For example, the devices formed inside the device-embedded boards 2 and 2a are not limited to capacitors and inductors, but devices such as piezoelectric bodies and resistors may be employed.

What is claimed is:

1. A device-embedded board comprising:
   a board main body that includes (i) an insulating layer with a first resin and (ii) a through-hole electrode penetrating the insulating layer;
   a conductor wiring layer inside or on a surface of the board main body; and
   a device formation layer inside the board main body and in contact with a portion of the conductor wiring layer, wherein
   the device formation layer is in an insulating region (i) in which a functional filler for forming a device is dispersed and (ii) including a second resin,
   the functional filler is a dielectric filler,
   the second resin is the same as the first resin or is a different resin having a melting point substantially the same as a melting point of the first resin,
   a conductor connection film is between the through-hole electrode and the conductor wiring layer, and
   the conductor connection film has a melting point lower than the melting point of the first resin.

2. The device-embedded board according to claim 1, wherein the insulating region includes a thermoplastic resin having a melting point substantially the same as the melting point of the first resin.

3. The device-embedded board according to claim 1, wherein the insulating layer and the insulating region are simultaneously formed by hot-pressing an insulating powder.

4. The device-embedded board according to claim 1, wherein the board main body includes a resin selected from a liquid crystal polymer and fluororesin.

5. The device-embedded board according to claim 1, wherein the conductor connection film includes a metal with a melting point that is lower than the melting point of the first resin by 10° C. to 50° C.

6. The device-embedded board according to claim 1, wherein the conductor connection film includes a metal with a melting point that is lower than the melting point of the first resin by 20° C. to 40° C.

7. The device-embedded board according to claim 1, wherein the conductor connection film includes a metal having a melting point lower than a melting point of a metal included in the through-hole electrode.

8. The device-embedded board according to claim 1, wherein the conductor connection film includes at least one metal selected from the group of Sn, Ag, Sn—Ag, Cu—Ag, and Sn—Cu.

* * * * *